United States Patent [19]
Schnizlein

[11] Patent Number: 6,047,036
[45] Date of Patent: Apr. 4, 2000

[54] SYSTEM AND METHOD FOR IMPLEMENTING A MUTE VOICE SIGNAL UPON RECEPTION OF A ADPCM ZERO NIBBLE IN WIRELESS COMMUNICATIONS

[75] Inventor: Paul G. Schnizlein, Austin, Tex.

[73] Assignee: Advanced Micro Devices, Inc., Sunnyvale, Calif.

[21] Appl. No.: 08/850,824

[22] Filed: May 2, 1997

[51] Int. Cl.[7] .................................................. H04B 1/10
[52] U.S. Cl. ............................................. 375/351; 375/217
[58] Field of Search .................................... 375/351, 241, 375/242, 244, 285, 316, 2, 217; 341/143, 126; 455/194.1, 223, 222; 714/755, 758, 765

[56] References Cited

U.S. PATENT DOCUMENTS

| | | | |
|---|---|---|---|
| 4,403,263 | 9/1983 | Kageyama et al. | 360/32 |
| 4,433,415 | 2/1984 | Kojima | 371/37 |
| 4,433,416 | 2/1984 | Kojima | 371/37 |
| 4,446,490 | 5/1984 | Hoshimi et al. | 360/32 |
| 4,451,920 | 5/1984 | Hoshimi | 371/40 |
| 4,459,696 | 7/1984 | Kojima | 371/38 |
| 5,309,443 | 5/1994 | Schorman | 375/351 |
| 5,317,522 | 5/1994 | Bonet et al. | 364/514 |
| 5,333,153 | 7/1994 | Brown et al. | 375/351 |
| 5,535,299 | 7/1996 | Riedel | 395/2.21 |
| 5,781,570 | 7/1998 | Hattori | 371/53 |
| 5,799,039 | 8/1998 | Laird et al. | 375/244 |

*Primary Examiner*—Chi H. Pham
*Assistant Examiner*—Emmanuel Bayard
*Attorney, Agent, or Firm*—Skjerven, Morrill, MacPherson, Franklin & Friel, LLP

[57] ABSTRACT

A system and method of muting a voice signal in a wireless communication system when an "all zeros" condition of a digitized serial voice input signal is detected. The mute signal which is generated when a zeros condition occurs is provided to a voice processor to initiate a mute algorithm to mute the processing of incoming voice data during the sample time of the zeros condition.

13 Claims, 1 Drawing Sheet

SYSTEM AND METHOD FOR IMPLEMENTING A MUTE VOICE SIGNAL UPON RECEPTION OF A ADPCM ZERO NIBBLE IN WIRELESS COMMUNICATIONS

BACKGROUND OF THE INVENTION

1. Field of the Invention

This invention relates to muting, or attenuating, speech signals in a compressed voice communication systems in general, and to ADPCM compression in particular, during "fade" periods.

2. Discussion of Related Technology

When wireless communication conditions are severe, or at the limit of usable communications range, bit errors occur rather frequently. Several formats, such as ADPCM, which stands for adaptive delta pulse code modulation, which conforms to a voice compression standard, such as CCITT G.721, can tolerate some bit errors without adversely affecting the quality of speech. But, errors which exceed one in a thousand ($10^{-3}$ BER) can cause significant speech degradation.

A system and method are needed to control those unacceptable errors by attenuating, or completely muting, the speech during those significant bit error times. In radio communications, these bit errors often come in bursts, during what is called a "fade", i.e., a temporary loss of radio signal. These fades can last 20 ms or more, and the deleterious effects of those bit errors on speech can be objectionable. Replacing that speech with silence, or attenuating the speech, is an improvement in speech reception quality.

SUMMARY OF THE INVENTION

To solve the problem of bit errors during the fade, or temporary loss of radio signal, periods, the present invention utilizes a circuit specially designed to detect an "all zeros condition", i.e. "0000", which is an erroneous reception and not a valid ADPCM code. This zeros decode function is performed outside of the ADPCM processor block typically utilized. The present invention performs such a zeros detect function. The zeros decode circuit generates a signal which is sent on to the ADPCM processor to trigger a noise suppression muting routine, which will last several sample periods and attenuate the speech during that time.

Currently, when using ADPCM, it is preferred that samples of four bit nibbles are sent, at a sample rate of 8 k samples/sec. Previously, when a code of "0000" was received, which is not a valid ADPCM code, the ADPCM receiver would simply ignore the sample and the information would be lost. Many errors caused noticeable degradation of the voice sample, making the received speech signal objectionable. In the present invention, the amount of attenuation and its duration are programmable parameters. The present function of automatically triggering a mute algorithm improves the perceived quality of the speech in the presence of received errors.

Previously, as an alternative to simply ignoring the samples, software was needed to monitor the quality of the communications link between the remote wireless device, such as a wireless handset telephone unit, and a base station, for conditions likely to produce errors. After monitoring an error prone situation, the speech was muted. The present invention frees the software from such a detailed maintenance of the communications link, so the clock rate of the software's processor may be reduced, thus saving power.

DETAILED DESCRIPTION OF THE PREFERRED EMBODIMENTS

Figure 1:
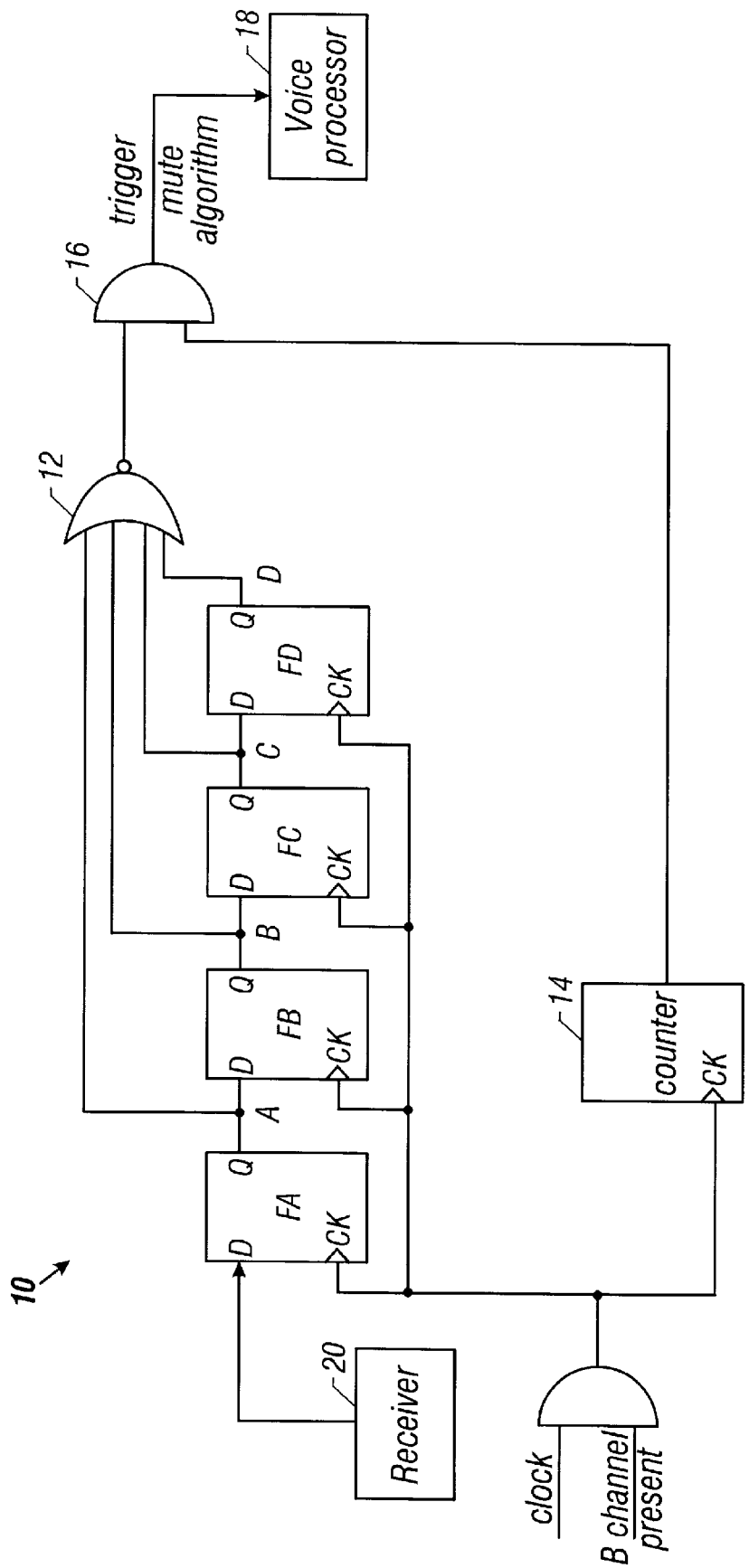
FIG. 1 schematically depicts an embodiment of the detection circuitry of the present invention.

There are many ways of accomplishing an "all zeros" detection for bit error conditions. One embodiment is shown in FIG. 1. Many different bit errors are possible, and only some of them result in the "all zeros" (i.e. "0000") code. Therefore, it is reasonable that when an all zeros code is detected, several other bit errors most likely have already occurred. Of course, sometimes a lone bit error outside of any burst can cause the zero code, but most likely, since most errors occur in bursts, and only some of them result in the zero code, many errors are occurring. The serial received data from the wireless communication receiver 20 is input to the shift register 10 formed by flip-flops FA, FB, FC and FD. Such a receiver is known in the art. Shift register 10 serves as a serial to parallel converter, assembling the four bit nibble that is the ADPCM word. The parallel output from the shift register 10, at points A, B, C and D, is applied to a NOR gate 12, the output of which will be logical one when all the inputs are a logical zero.

The counter 14 counts to four during each received 4-bit sample of voice data, as the four bit word nibbles are received. When the count=4, the nibble is correctly aligned. The output of the NOR gate 12 is then allowed through AND gate 16. When an all zero situation is decoded, the output of AND gate 16 will be a logical one and is provided to the voice processor 18, which is preferably a ADPCM processor, or to any other device which will utilize the signal, to initiate a mute algorithm to mute the processing of the incoming voice data during the bit error time frame. Quiet is better than noise.

This implementation detects the zero nibble as the serial stream is assembled. It is also possible to detect the zero condition in a ADPCM codec (not shown), or in a FIFO (not shown) that typically is connected between the serial bit stream and the ADPCM codec.

The foregoing disclosure and description of the invention and examples provided are illustrative and explanatory of the preferred embodiments. Changes in the size, shape, materials, elements and individual components used, the connections made, may be made without departing from the spirit and scope of the inventions herein claimed.

What is claimed is:

1. A method of muting a voice signal in a wireless communication system, comprising:
   a) providing a digitized, serial input signal representing received voice information to a serial to parallel converter circuit;
   b) detecting an error code associated with said input signal by a logic circuit connected to a plurality of outputs of said serial to parallel converter circuit; and
   c) generating a voice mute signal by said logic circuit upon detection of said error code;
   wherein said detecting is accomplished such that if a prespecified number of consecutive bits comprising said input signal are a logic zero, an all zeros condition is detected which comprises said error code.

2. The method of claim 1, further comprising:
   providing a word received signal to said logic circuit which is utilized in generating said voice mute signal.

3. The method of claim 1, further comprising:
   shifting said digitized input signal through a shift register by said serial to parallel converter circuit prior to generating said voice mute signal.

4. The method of claim 2, further comprising:

counting the number of bits comprising said input signal to determine when to generate said word received signal.

5. The method of claim 1, wherein said voice mute signal is provided to a voice processor to initiate a mute algorithm to mute the processing of incoming voice data.

6. The method of claim 1, wherein said input signal comprises a 4 bit word.

7. The method of claim 1, wherein said input signal is formatted as a ADPCM signal.

8. A zero nibble detect circuit, comprising:
a) a wireless communication receiver;
b) a serial to parallel (STP) converter circuit having an input connected to said receiver;
c) a counter;
d) a clock signal input to said STP converter circuit and to said counter; and
e) a logic circuit having a plurality of inputs connected to said STP converter circuit and another input connected to said counter;
wherein a plurality of serial data bits representing audio data is output from said receiver and is input to said STP converter circuit; and
wherein when an error code associated with said serial data bits is detected, said logic circuit outputs a mute signal; and
wherein when a prespecified consecutive number of said serial data bits are at a logic zero, said error code is detected and said logic circuit outputs a mute signal.

9. The circuit of claim 8, further comprising a voice processor, wherein said mute signal is provided to said voice processor.

10. The circuit of claim 8, wherein said prespecified number of bits is four.

11. The circuit of claim 9 wherein said serial to parallel converter circuit further includes a shift register.

12. The circuit of claim 11 wherein said shift register includes a plurality of flip flops, each of said plurality of flip flops has an output connected to a respective input of said plurality of inputs of said logic circuit.

13. A zero nibble detect circuit, comprising:
a) a wireless communication receiver;
b) a serial to parallel (STP) converter circuit having an input connected to said receiver;
c) a counter;
d) a clock signal input to said STP converter circuit and to said counter; and
e) a logic circuit having a plurality of inputs connected to said STP converter circuit and another input connected to said counter;
wherein a plurality of serial data bits representing audio data is output from said receiver and is input to said STP converter circuit;
wherein when an error code associated with said serial data bits is detected, said logic circuit outputs a mute signal; and
wherein said counter outputs an alignment signal to said logic circuit indicating an alignment of an audio data word in said serial to parallel converter, wherein said mute signal can only be outputted by said logic circuit when said alignment signal indicates an alignment of an audio data word.

* * * * *